US005506550A

United States Patent [19]

Waters

[11] Patent Number: 5,506,550

[45] Date of Patent: Apr. 9, 1996

[54] ATTENUATOR FOR USE WITH CURRENT TRANSFORMER

[75] Inventor: Christopher A. Waters, Redwood City, Calif.

[73] Assignee: Pearson Electronics, Inc., Palo Alto, Calif.

[21] Appl. No.: 290,357

[22] Filed: Aug. 15, 1994

[51] Int. Cl.[6] .................... H03H 7/24

[52] U.S. Cl. .................... 333/81 R; 333/81 A

[58] Field of Search .................... 333/81 R, 81 A; 323/353, 369, 370; 327/290, 306, 310, 311, 315, 317

[56] References Cited

U.S. PATENT DOCUMENTS

| | | | |
|---|---|---|---|
| 3,146,417 | 8/1964 | Pearson | 336/69 |
| 4,968,901 | 11/1990 | Shacter | 333/81 R X |
| 5,191,303 | 3/1993 | Porter et al. | 333/81 R |

FOREIGN PATENT DOCUMENTS

| | | | |
|---|---|---|---|
| 160201 | 8/1985 | Japan | 333/81 A |

*Primary Examiner*—Paul Gensler
*Attorney, Agent, or Firm*—Flehr, Hohbach Test Albritton & Herbert

[57] ABSTRACT

An attenuator for use with a current transformer. The attenuator includes an input voltage terminal, an input ground terminal, an output voltage terminal, an output ground terminal, an input resistive arm, a shunt resistive arm, an output resistive arm, and a compensation circuit. The input and output ground terminals are coupled together. The input resistive arm has a first end coupled to the input voltage terminal and a second end. The output resistive arm has a first end coupled to the output voltage terminal and a second end coupled to the second end of the input resistive arm. The shunt resistive arm has a first end coupled to the input and output ground terminals and a second end coupled to the second ends of the input and output resistive arms. The shunt resistive arm has a shunt resistance and an intrinsic inductance effectively in series with the resistance. The compensation circuit has a first end coupled to the input and output ground terminals and a second end coupled to the second ends of the input, output, and shunt resistive arms. The compensation circuit has an impedance selected to reduce output voltage overshoot across the output voltage and output ground terminals caused by the intrinsic inductance of the shunt resistive arm in response to an input voltage provided by the current transformer across the input voltage and input ground terminals.

12 Claims, 5 Drawing Sheets

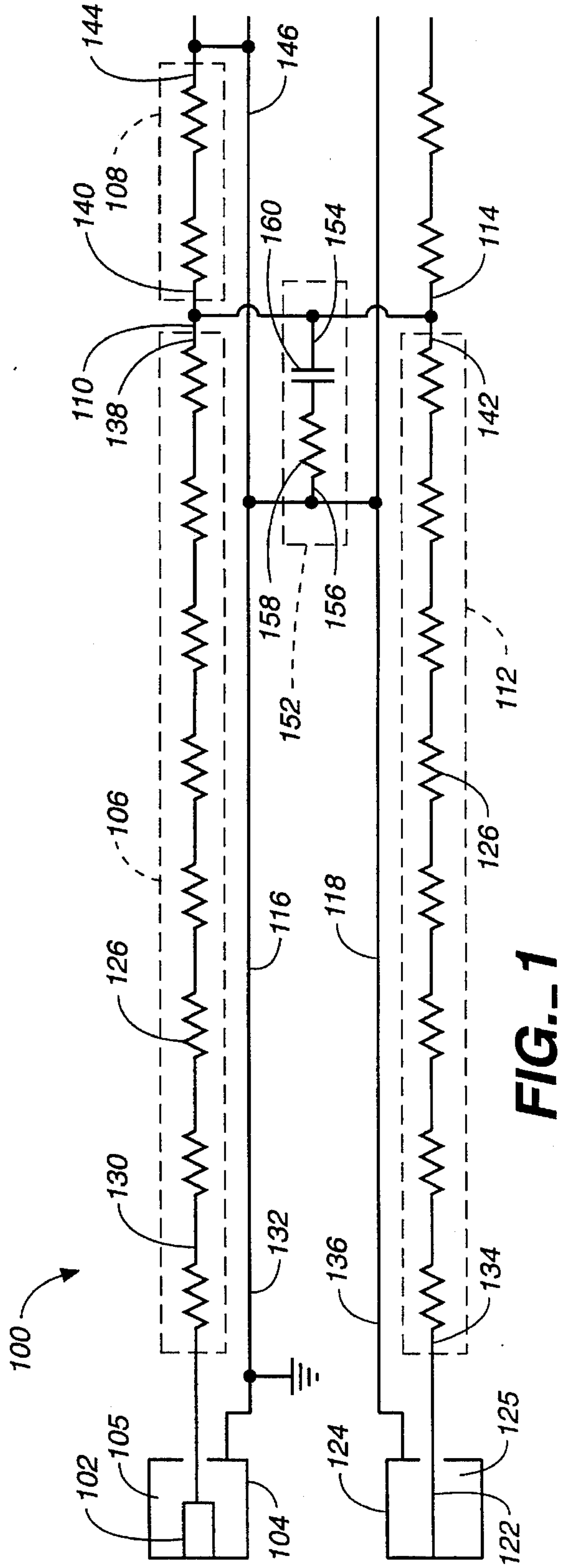
FIG._1
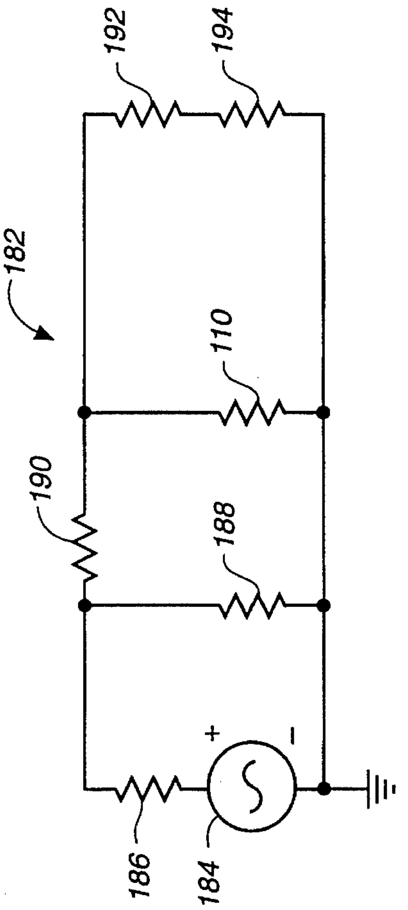
FIG._4
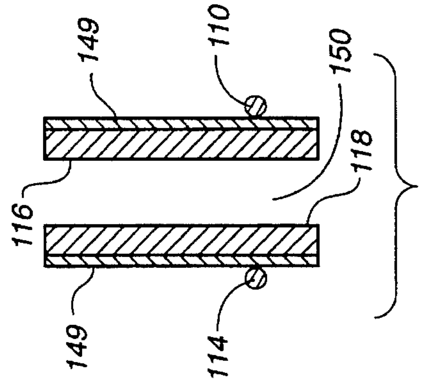
FIG._3

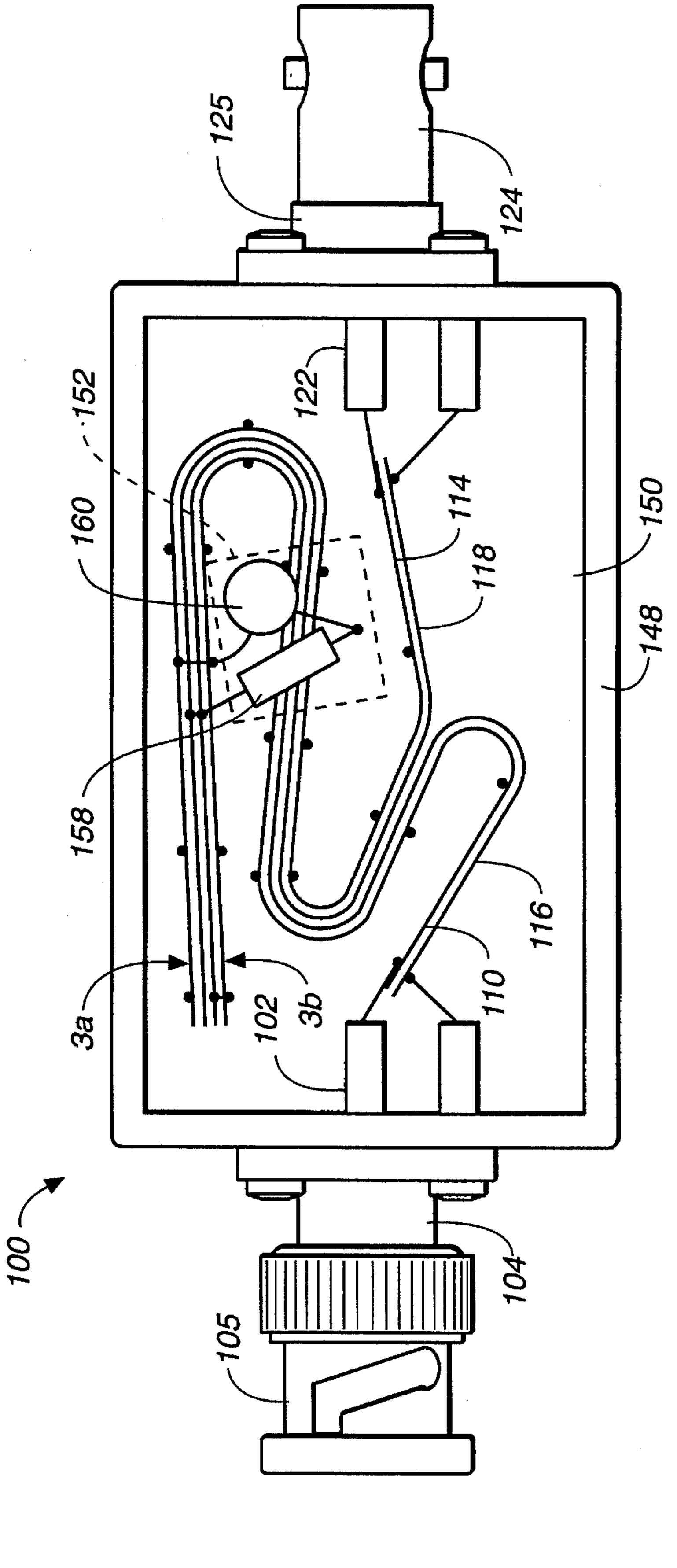
FIG._2

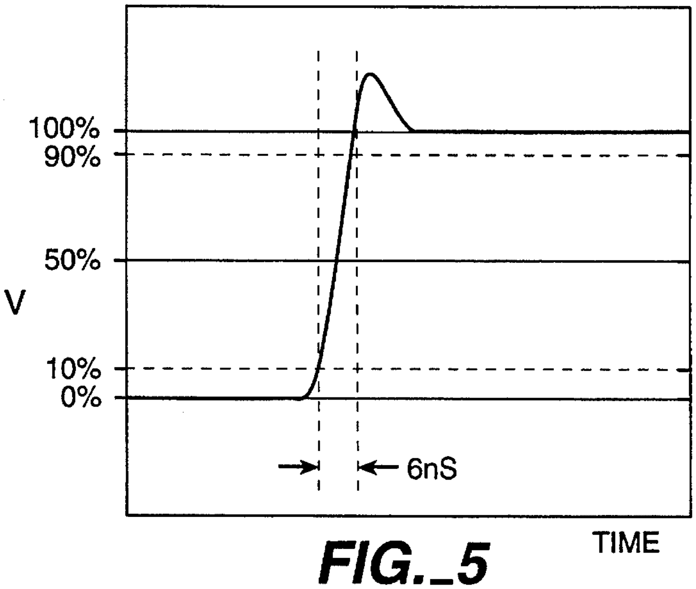
FIG._5
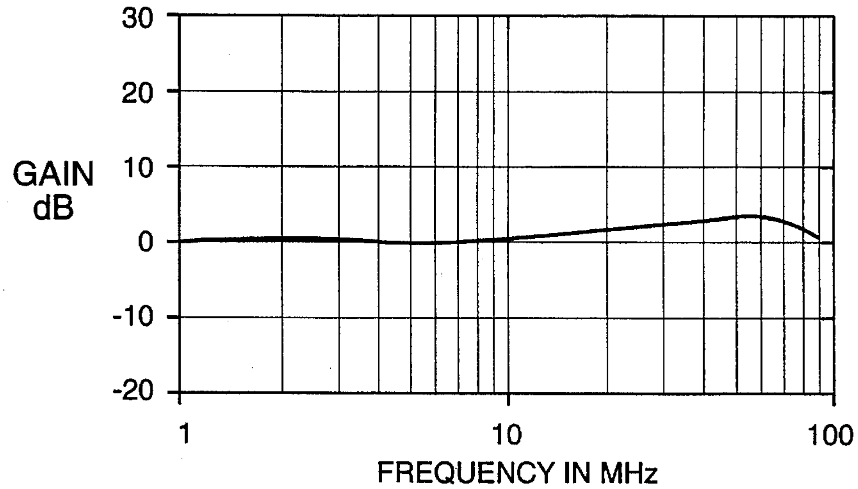
FIG._6
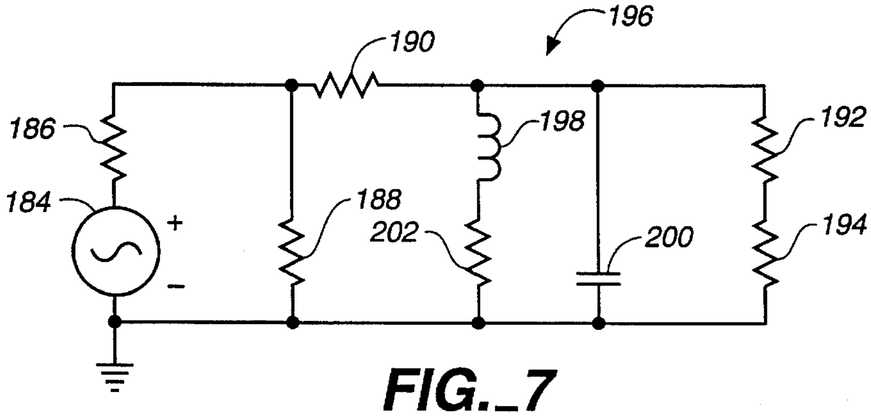
FIG._7

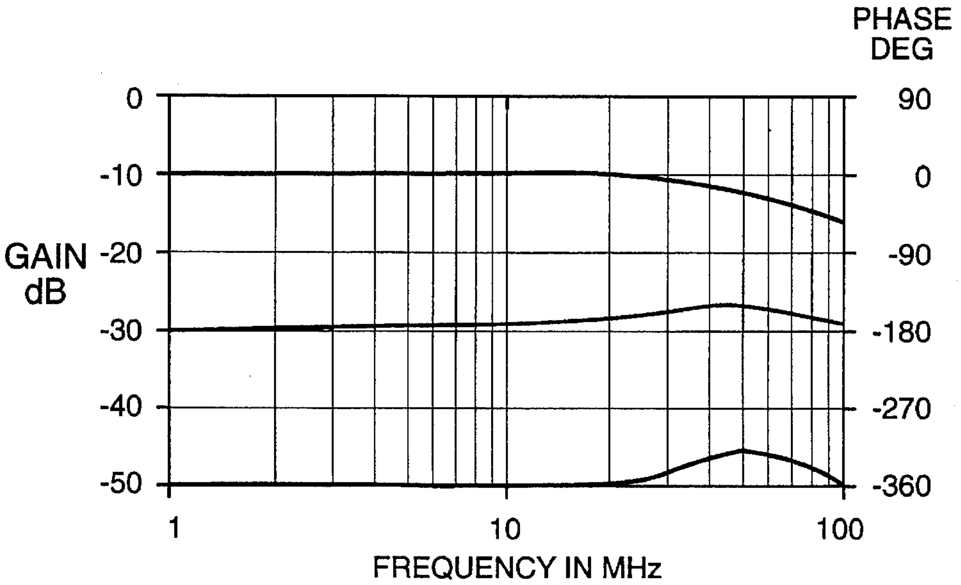
FIG._8
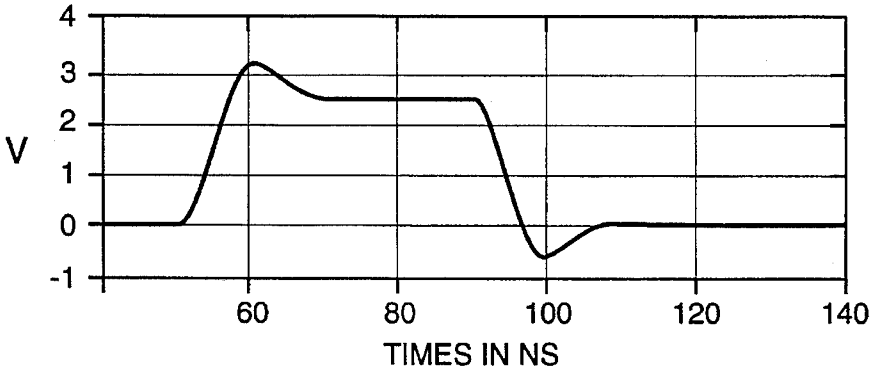
FIG._9
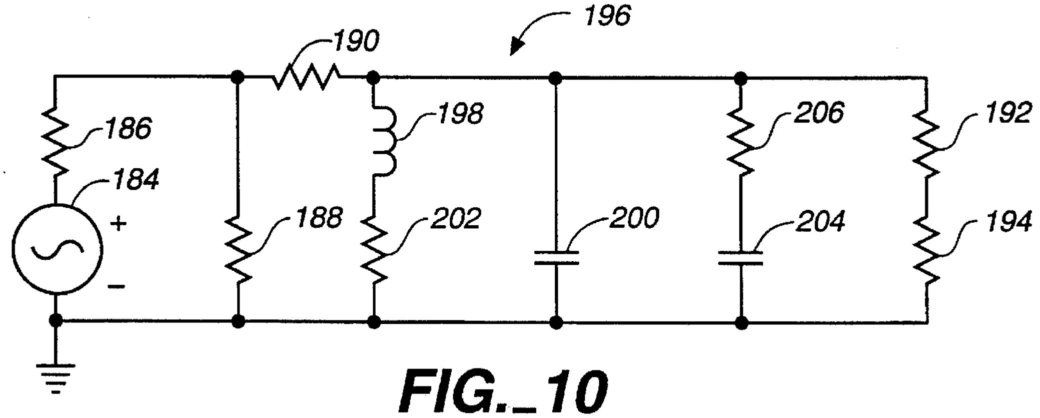
FIG._10

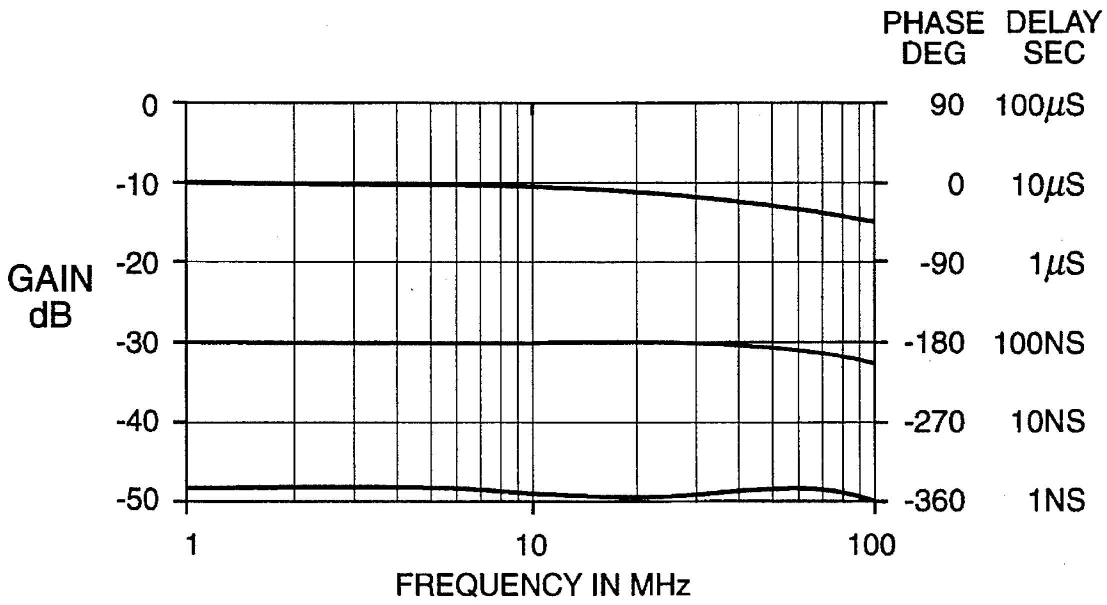
*FIG._11*
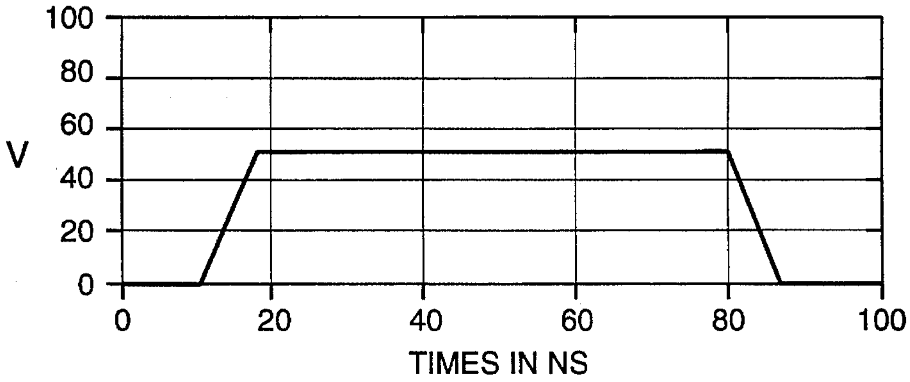
*FIG._12*

ATTENUATOR FOR USE WITH CURRENT TRANSFORMER

The present invention relates generally to attenuators. Specifically, it relates to an attenuator for attenuating the voltage of the output signal of a current transformer.

BACKGROUND OF THE INVENTION

The maximum pulse rating of many standard current transformers (or monitors) is limited by the voltage rating of the output connector. Typically, this is in the neighborhood of 500 volts. However, most oscilloscopes can only handle an output signal from a current transformer having a voltage below 40 volts.

Current transformer attenuators have been used in the past to provide oscilloscopes with voltages that they can handle. However, these attenuators do not provide the total combination of (a) adequate input to output voltage reduction, (b) matched impedance at the input and output terminals of the attenuator, (c) enough peak power capacity for the output signal of standard current transformers, and (d) a bandwidth commensurate with the current transformers to which they are coupled.

SUMMARY OF THE INVENTION

The foregoing problems are solved by an attenuator for use with a current transformer which includes an input voltage terminal, an input ground terminal, an output voltage terminal, an output ground terminal, an input resistive arm, a shunt resistive arm, an output resistive arm, and a compensation circuit.

The input and output ground terminals are coupled together. The input resistive arm has a first end coupled to the input voltage terminal and a second end. The output resistive arm has a first end coupled to the output voltage terminal and a second end coupled to the second end of the input resistive arm. The shunt resistive arm has a first end coupled to the input and output ground terminals and a second end coupled to the second ends of the input and output resistive arms.

The shunt resistive arm has a shunt resistance and an intrinsic inductance effectively in series with the shunt resistance. The compensation circuit has a first end coupled to the input and output ground terminals and a second end coupled to the second ends of the input, output, and shunt resistive arms. The compensation circuit has an impedance selected to reduce output voltage overshoot across the output voltage and output ground terminals caused by the intrinsic inductance of the shunt resistive arm in response to an input voltage provided by the current transformer across the input voltage and input ground terminals.

BRIEF DESCRIPTION OF THE DRAWINGS

The invention will be more readily apparent from the following detailed description and appended claims when taken in conjunction with the drawings, in which:

FIG. 1 is a schematic view of an attenuator in accordance with the present invention;

FIG. 2 provides a top view of the attenuator of FIG. 1 with the top of the casing removed;

FIG. 3 is cross sectional view of the attenuator of FIG. 2 along the line *3a–3b* of FIG. 2;

FIG. 4 is a test circuit used in determining the impedance of the overshoot compensation circuit of the transformer of FIG. 1;

FIG. 5 is an observed and recorded time domain response of the test circuit of FIG. 4;

FIG. 6 is an observed and recorded frequency domain response of the test circuit of FIG. 4;

FIG. 7 is the equivalent circuit for the test circuit of FIG. 4;

FIG. 8 is the modeled frequency response of the equivalent circuit of FIG. 7;

FIG. 9 is the modeled time domain response of the equivalent circuit of FIG. 7;

FIG. 10 is the equivalent circuit of FIG. 7 with an added compensation resistance and capacitance;

FIG. 11 is the modeled frequency response of the equivalent circuit of FIG. 10 with the flattest response; and FIG. 12 is the modeled time domain response of the equivalent circuit of FIG. 10 with the least output signal overshoot.

DETAILED DESCRIPTION OF THE INVENTION

Referring to FIG. 1, there is a schematic view of an attenuator 100 for use with a current transformer. In operation, the attenuator 100 receives an input voltage from the current transformer across the input voltage and input ground terminals 102 and 104 of the BNC input connector 105. The input and shunt resistive arms 106 and 108 of the resistive wire 110 and the output resistive arm 112 of the resistive wire 114 attenuate the input voltage in conjunction with the planar conductors 116 and 118 and the overshoot compensation circuit 152. The attenuated input voltage is then provided as an output voltage across the output voltage and output ground terminals 122 and 124 of the BNC output connector 125 for display by an oscilloscope.

The input, shunt, and output resistive arms 106, 108, and 112 are distributed resistances accurately divided into eight, two, and eight equal sections 126, respectively. Each section 126 has a resistance of 5 ohms such that the input and output resistive arms 106 and 112 each have a resistance of 40 ohms while the shunt resistive arm 108 has a resistance of 10 ohms.

The input voltage terminal 102 is coupled to the resistive wire 110 at the end 130 of the input resistive arm 106. The input ground terminal 104 is coupled to the end 132 of the planar conductor 116.

The output voltage terminal 122 is coupled to the resistive wire 114 at the end 134 of the output resistive arm 112. The output ground terminal 124 is coupled to the end 136 of the planar conductor 118.

The ends 138, 140, and 142 respectively of the input resistive arm 106, shunt resistive arm 108, and output resistive arm 112 are all coupled together. The end 144 of the shunt resistive arm 108 is coupled to the end 146 of the planar conductor 116 while the planar conductors 116 and 118 are coupled together.

As shown in FIG. 2, the resistive wires 110 and 114 traverse a long path within the casing 148 of the attenuator 100. As a result, the resistive wires 110 and 114 have rather large intrinsic inductances (i.e., inductances per unit length) associated with them. Specifically, the input and shunt resistive arms 106 and 108 of the resistive wire 110 each have an intrinsic inductance effectively in series with their respective resistances. Moreover, the output resistive arm 112 has an intrinsic inductance effectively in series with its resistance. These intrinsic inductances are reduced by use of the planar conductors 116 and 118.

The distributed resistive wires 110 and 114 may be the same as those used as resistive terminations in a standard Model 4100 Current Transformer by Pearson Electronics, Inc. Moreover, the planar conductors 116 and 118 may be the same as those used in conjunction with the resistive terminations in these Pearson Current Transformers. These resistive terminations and planar conductors are also described in U.S. Pat. No. 3,146,417, which is hereby explicitly incorporated by reference.

As shown in FIG. 3, the planar conductors 116 and 118 are respectively spaced parallel and closely adjacent to the resistive wires 110 and 114. This spacing is approximately 0.001 inches and is provided by insulating double sided adhesive Kapton tape 149. An epoxy filler 150 fills in the remaining space within the casing 148, as also shown in FIG. 2.

Referring again to FIG. 2, because the planar conductor 116 is spaced parallel and adjacent to the resistive wire 110, the resistive wire 110 and planar conductor 116 together comprise one transmission line which reduces the intrinsic inductance of the input and shunt resistive arms 106 and 108. Similarly, because the planar conductor 118 is spaced parallel and adjacent to the resistive wire 114, the resistive wire 114 and the planar conductor 118 form another transmission line which reduces the intrinsic inductance of the output resistive arm 112. Nevertheless, the amount of the intrinsic inductance of the shunt resistive arm 108 is still significant and particularly affects the performance of the attenuator 100.

Specifically, in response to a rapid change in the input voltage across the input voltage and input ground terminals 102 and 104, a voltage spike is induced across the intrinsic inductance of the shunt resistive arm 108. This results in output voltage overshoot across the output voltage and output ground terminals 122 and 124.

In order to reduce this output voltage overshoot, the attenuator 100 includes the compensation circuit 152. The compensation circuit 152 has an impedance that, as will be discussed shortly, is selected to compensate for, offset, and reduce the output voltage overshoot due to the intrinsic inductance of the shunt resistive arm 108.

As shown in FIG. 1, the compensation circuit 152 has one end 154 coupled to the ends 138, 140, and 142 of the input, shunt, and output resistances 106, 108, and 112, respectively, and another end 156 coupled to the planar conductors 116 and 118. The compensation circuit 152 includes a resistor 158 and a capacitor 160 connected in series. The series connection of the resistance of the resistor 158 and the capacitance of the capacitor 160 forms the impedance of the compensation circuit 152. The resistance of the resistor 158 and the capacitance of the capacitor 160 are determined and selected as follows.

First, the resistive wire 110 is connected as shown in FIG. 4 in the test circuit 182. The test circuit 182 includes the resistive wire 110, the adjustable rise-time current step generator 184, the 50 ohm resistor 186, the 55 ohm resistor 188, the 470 ohm resistor 190, the 19.5 ohm resistor 192, and the 31.5 ohm resistor 194.

In response to a current step generated by the current step generator 184, a voltage is developed across the resistive wire 110. This voltage is observed and recorded in the time domain, as shown in FIG. 5, with an oscilloscope and in the frequency domain, as shown in FIG. 6, with a spectrum analyzer.

FIG. 7 shows the equivalent circuit 196 for the test circuit 182. The equivalent circuit 196 takes into account the intrinsic inductance 198 and intrinsic capacitance 200 of the resistive wire 110. Thus, the intrinsic inductance 198 is connected in series with the total resistance 202 (i.e., the combined resistances of the input resistive arm 106 and the shunt resistive arm 108) of the resistive wire 110. Moreover, the intrinsic capacitance 200 is connected in parallel to the series connection of the intrinsic inductance 198 and resistance 202.

The equivalent circuit 196 is modeled with a commercially available computer program called MICROCAP by Spectrum Software, Inc. and Addison Wesley Publishing Co. The model values for the resistance 202 of the resistive wire 110, the intrinsic inductance 198, and the intrinsic capacitance 200 are varied by the user of the MICROCAP program until the model frequency response, shown in FIG. 8, and the model time domain response, shown in FIG. 9, for the equivalent circuit 196 match as close as possible the observed and recorded frequency response, shown in FIG. 5, and time domain response, shown in FIG. 6, for the test circuit 182.

A compensation capacitance 204 and compensation resistance 206 is then added to the model for the equivalent circuit 196, as shown in FIG. 10. The model values for the resistance 202 of the resistive wire 110, the intrinsic inductance 198, and the intrinsic capacitance 200 which resulted in the closest match are kept fixed while the user of the MICROCAP program varies the model values for the resistance 206 and the capacitance 204. This is done until the flattest model frequency response, shown in FIG. 11, and the least output voltage overshoot in the model time domain response, shown in FIG. 12, is obtained by the MICROCAP program. The model values of the resistance 206 and capacitance 204 for which this occurs are typically in the range of 60–80 ohms for the resistance 206 and 50–100 pF for the capacitance 204.

The model values for the resistance 206 and the capacitance 204 are then scaled to obtain initial values selected for the resistor 158 and capacitor 160 of the compensation circuit 152. These values are scaled by a factor of0.2 since the resistance (10 ohms) of the shunt resistive arm 108 is 0.2 times that of the resistance (50 ohms) of the entire resistive wire 110.

A spectrum analyzer is then connected across the BNC input and output connectors 105 and 125 of the attenuator 100. The initial values for the resistor 158 and capacitor 160 are then refined experimentally by determining with the spectrum analyzer which values for the resistor 158 and capacitor 160 provide the flattest frequency response and least output voltage overshoot in the time domain.

As described earlier, in the preferred embodiment, the compensation circuit 152 includes the resistor 158 in series with the capacitor 160. But, in the simplest case, the compensation circuit 152 could simply include the capacitor 160. Referring to FIG. 5, this would roll off the frequency response and get rid of the broad high frequency peak. However, in order to reduce the effects of the capacitor 160 at frequencies above the broad high frequency peak the resistor 158 is employed.

Attenuator 100 described herein provides a 10:1 input to output voltage reduction suitable for use with standard oscilloscopes that can display only up to 40 volts. Furthermore, the input, shunt, and output resistive arms 106, 108, and 112 provide the attenuator 100 with 50 ohm matched impedances at the input voltage and output voltage terminals 102 and 122. Moreover, since the resistive wires 110 and 114 may be the same as those used in a standard Model 4100 Current Transformer by Pearson Electronics, Inc., the attenuator 100 has sufficient peak power capacity for the output voltage of such a current transformer and also has a bandwidth commensurate with such a current transformer.

While the present invention has been described with reference to a few specific embodiments, the description is illustrative of the invention and is not to be construed as limiting the invention. Furthermore, various other modifications may occur to those skilled in the art without departing from the true spirit and scope of the invention as defined by the appended claims.

What is claimed is:

1. An attenuator for use with a current transformer, the attenuator comprising:

an input voltage terminal;

an input ground terminal;

an output voltage terminal;

an output ground terminal coupled to the input ground terminal;

an input resistive arm having a first end coupled to the input voltage terminal and a second end;

an output resistive arm having a first end coupled to the output voltage terminal and a second end coupled to the second end of the input resistive arm;

a shunt resistive arm having a first end coupled to the input and output ground terminals and a second end coupled to the second ends of the input and output resistive arms, the shunt resistive arm having a shunt resistance and an intrinsic inductance effectively in series with the shunt resistance; and a compensation circuit having a first end coupled to the input and output ground terminals and a second end coupled to the second ends of the input, output, and shunt resistive arms, the compensation circuit having an impedance that reduces for frequencies of 100 MHz and below output voltage overshoot across the output voltage and output ground terminals caused by the intrinsic inductance of the shunt resistive arm in response to an input voltage provided by the current transformer across the input voltage and input ground terminals.

2. An attenuator as recited in claim 1 wherein the compensation circuit comprises:

a resistor having a compensation resistance; and a capacitor coupled in series with the resistor and having a compensation capacitance;

the compensation resistance and the compensation capacitance reducing the output voltage overshoot.

3. An attenuator as recited in claim 1 further comprising:

a first resistive wire comprising the input and shunt resistive arms;

a first conductor spaced parallel and adjacent to the first resistive wire, the first conductor coupled to the input ground terminal, to the first resistive wire at the first end of the shunt resistive arm, and to the first end of the compensation circuit;

a second resistive wire comprising the output resistive arm;

a second conductor spaced parallel and adjacent to the second resistive wire, the second conductor coupled to the input ground terminal, to the first end of the compensation circuit, and to the first conductor.

4. An attenuator for use with a current transformer, the attenuator comprising:

an input voltage terminal;

an input ground terminal;

an output voltage terminal;

an output ground terminal coupled to the input ground terminal;

an input resistive arm having a first end coupled to the input voltage terminal and a second end;

an output resistive arm having a first end coupled to the output voltage terminal and a second end coupled to the second end of the input resistive arm;

a shunt resistive arm having a first end coupled to the input and output ground terminals and a second end coupled to the second ends of the input and output resistive arms, the shunt resistive arm having a shunt resistance and an intrinsic inductance effectively in series with the shunt resistance; and a compensation circuit having a first end coupled to the input and output ground terminals and a second end coupled to the second ends of the input, output, and shunt resistive arms, the compensation circuit comprising a resistor and a capacitor coupled in series with the resistor, the resistor having a compensation resistance and the capacitor having a compensation capacitance that reduce output voltage overshoot across the output voltage and output ground terminals caused by the intrinsic inductance of the shunt resistive arm in response to an input voltage provided by the current transformer across the input voltage and input ground terminals.

5. An attenuator as recited in claim 4 further comprising:

a first resistive wire comprising the input and shunt resistive arms;

a first conductor spaced parallel and adjacent to the first resistive wire, the first conductor coupled to the input ground terminal, to the first resistive wire at the first end of the shunt resistive arm, and to the first end of the compensation circuit;

a second resistive wire comprising the output resistive arm;

a second conductor spaced parallel and adjacent to the second resistive wire, the second conductor coupled to the input ground terminal, to the first end of the compensation circuit, and to the first conductor.

6. An attenuator as recited in claim 5 wherein the compensation capacitance and the compensation resistance reduce for frequencies of 100 MHz and below output voltage overshoot across the output voltage and output ground terminals.

7. An attenuator for use with a current transformer, the attenuator comprising:

an input voltage terminal;

an input ground terminal;

an output voltage terminal;

an output ground terminal coupled to the input ground terminal;

a first resistive wire comprising an input resistive arm having a first end coupled to the input voltage terminal and a second end;

a second resistive wire comprising an output resistive arm having a first end coupled to the output voltage terminal and a second end coupled to the second end of the input resistive arm;

the first resistive wire further comprising a shunt resistive arm having a first end coupled to the input and output ground terminals and a second end coupled to the second ends of the input and output resistive arms, the shunt resistive arm having a shunt resistance and an intrinsic inductance effectively in series with the shunt resistance;

a compensation circuit having a first end coupled to the input and output ground terminals and a second end coupled to the second ends of the input, output, and shunt resistive arms, the compensation circuit having an impedance that reduces voltage overshoot across the output voltage and output ground terminals caused by the intrinsic inductance of the shunt resistive arm in response to an input voltage provided by the current transformer across the input voltage and input ground terminals.

a first conductor spaced parallel and adjacent to the first resistive wire, the first conductor coupled to the input ground terminal, to the first resistive wire at the first end of the shunt resistive arm, and to the first end of the compensation circuit; and a second conductor spaced parallel and adjacent to the second resistive wire, the second conductor coupled to the input ground terminal, to the first end of the compensation circuit, and to the first conductor.

8. An attenuator as recited in claim 7 wherein the compensation circuit comprises:

a resistor having a compensation resistance; and a capacitor coupled in series with the resistor and having a compensation capacitance;

the compensation resistance and the compensation capacitance reducing the output voltage overshoot.

9. An attenuator as recited in claim 7 wherein the impedance of the compensation circuit reduces for frequencies of 100 MHz and below output voltage overshoot across the output voltage and output ground terminals.

10. A method of selecting an impedance for a compensation circuit included in an attenuator used with a current transformer, the attenuator further including:

an input voltage terminal;

an input ground terminal;

an output voltage terminal;

an output ground terminal coupled to the input ground terminal;

an input resistive arm having a first end coupled to the input voltage terminal and a second end;

an output resistive arm having a first end coupled to the output voltage terminal and a second end coupled to the second end of the input resistive arm;

a resistive wire comprising a shunt resistive arm, the shunt resistive arm having a first end coupled to the input and output ground terminals and a second end coupled to the second ends of the input and output resistive arms, the resistive wire having a resistance, an intrinsic inductance, and an intrinsic capacitance such that the shunt resistive arm has a shunt resistance, a shunt intrinsic inductance, and a shunt intrinsic capacitance; and the compensation circuit having a first end coupled to the input and output ground terminals and a second end coupled to the second ends of the input, output, and shunt resistive arms, the impedance of the compensation circuit reducing output voltage overshoot across the output voltage and output ground terminals caused by the shunt intrinsic inductance in response to an input voltage provided by the current transformer across the input voltage and input ground terminals;

the method comprising the steps of:

determining the frequency and time domain responses of the resistive wire in response to a current step applied across the resistive wire;

modeling the frequency and time domain response of the resistive wire in an equivalent circuit for the resistive wire to match the determined frequency and time domain responses and determine the resistance, intrinsic inductance, and intrinsic capacitance of the resistive wire;

adding a compensation circuit with an impedance to the equivalent circuit;

modeling the frequency and time domain response of the resistive wire in the equivalent circuit with the added compensation circuit to determine the impedance of the compensation circuit of the equivalent circuit for which the frequency response across the resistive wire is the flattest and the time domain response across the resistive wire shows the least output voltage overshoot; and selecting the impedance of the compensation circuit of the attenuator based on the determined impedance of the compensation circuit of the equivalent circuit.

11. A method as recited in claim 10 wherein:

the resistive wire further comprises the input resistive arm;

the input resistive arm has an input resistance;

the selecting step comprises scaling the determined impedance of the compensation circuit of the equivalent circuit by the ratio of the shunt resistance to the input resistance.

12. A method as recited in claim 10 wherein the impedance of the compensation circuit of the equivalent circuit is determined for which the frequency response across the resistive wire is the flattest and the time domain response across the resistive wire shows the least output voltage overshoot in the time domain response for frequencies of 100 MHz and below.

* * * * *